US 6,691,912 B2

United States Patent
Carano et al.

(10) Patent No.: US 6,691,912 B2
(45) Date of Patent: Feb. 17, 2004

(54) METHODS OF AVOIDING BLOWHOLE FORMATION BY CONDITIONING THROUGH HOLES AND GLASS

(75) Inventors: Michael V. Carano, Plymouth, MN (US); Frank Polakovic, Plymouth, MN (US)

(73) Assignee: Electrochemicals, Inc., Maple Plains, MN (US)

( * ) Notice: Subject to any disclaimer, the term of this patent is extended or adjusted under 35 U.S.C. 154(b) by 6 days.

(21) Appl. No.: 10/087,051

(22) Filed: Mar. 1, 2002

(65) Prior Publication Data

US 2002/0139686 A1 Oct. 3, 2002

Related U.S. Application Data

(62) Division of application No. 09/478,587, filed on Jan. 6, 2000, now Pat. No. 6,375,731.

(51) Int. Cl.⁷ ............................................. B23K 31/02
(52) U.S. Cl. ..................... 228/256; 228/206; 228/209; 228/214
(58) Field of Search ................... 228/205, 206, 228/207, 208, 209, 214, 223, 179.1, 180.22, 256

(56) References Cited

U.S. PATENT DOCUMENTS

| | | | |
|---|---|---|---|
| 3,556,883 A | 1/1971 | Naito et al. | 156/20 |
| 5,139,642 A | 8/1992 | Randolph et al. | 205/125 |
| 5,389,270 A | 2/1995 | Thorn et al. | 252/22 |
| 5,476,580 A | 12/1995 | Thorn et al. | 205/122 |
| 5,585,427 A | 12/1996 | Schimmel et al. | 524/377 |
| 5,690,805 A | 11/1997 | Thorn et al. | 205/118 |
| 5,725,807 A | 3/1998 | Thorn et al. | 252/510 |
| 6,375,731 B1 | 4/2002 | Carano et al. | 106/287.35 |

FOREIGN PATENT DOCUMENTS

WO    WO 01/50821 A3    7/2001

OTHER PUBLICATIONS

Lea, et al., Blowholing in PTH Solder Fillets Assessment of the Problem (Part 1) *Circuit World* 12(4): 14–19 (1986).
Lea, et al., Blowholing in PTH Solder Fillets The Nature, Origin and Evolution of the Gas (Part 2) *Cicuit World* 12(4):1–25 (1986).
Lea, et al., "Blowholing in PHR Solder Fillets Moisture and PCB," (Part 3) *Circuit World* 12(4):26–33 (1986).
Lea, et al., "Blowholing in PHT Solder Fillets The Plated Copper Barrel," (Part 4) Circuit World 13(1):28–34, (1986).

(List continued on next page.)

Primary Examiner—M. Alexandra Elve
Assistant Examiner—Len Tran
(74) Attorney, Agent, or Firm—McAndrews, Held & Malloy, Ltd.

(57) ABSTRACT

A composition and method for cleaning and conditioning a non-conductive surface defined by a through hole in a printed circuit board (PCB) is disclosed. The through hole surface is contacted with the composition of the invention to provide a cleaned and conditioned surface. The clean and conditioned surface is coated with conductive carbon particles (usually graphite) to provide a carbon-coated surface. The carbon-coated surface is electro plated and then soldered using hot solder. Those surfaces that have been soldered and also treated with the composition of the invention exhibit fewer blow hole problems. The composition of the invention comprises carbonates, binders, and resins, and combinations thereof, that improve the adhesion and coverage of a coating containing graphite to a surface defined by a through hole bore or other substrate. ("Through holes" as used herein refers both to through holes and to vias.)

10 Claims, 2 Drawing Sheets

OTHER PUBLICATIONS

Lea, et al., "Blowholing in PHT Solder Fillets The Role of the Electroless Copper," *Part 5) Ciruit World 13*(1): 35–42 (1986).

Lea, et al., "Blowholing in PHT Solder Fillets The Laminate, The Drilling and Hole Wall Preparation," (*Part 6*) *Circuit World 13*(1):43–50 (1986).

Lea, et al., "Blowholing in PHT Solder Fillets Optimising the Soldering," (Parat 7) *Circuit World 13*(2):42–45 (1987).

Lea, et al., "Blowholing in PHT Solder Fillets The Scientific Framework Leading to Recommindations for Its Elimination," (Part 8) *Circuit World 13*(3):11–20 (1987).

Lea, "the Harmfulness of Blowholes in PHT Soldered Assemblies," *Circuit World, 16* (4):23–28 (1990).

Xanthan Gum: natural biogum for scientific water control, Kelco Fourth Edition 6 pages (date unknown).

Acrysol® Thickners and Rheology Modifiers—A selection guide WorldWide Rheology Modifiers 5 pages (date unknown).

Resins, Water–Soluble, vol. 20 pp. 207–225 (date unkown).

Aqualon Sodium Carboxymethylcellulose Physical and Chemical Properties, Hercules 22 pages (date unknown).

| SHADOW® Dip Process (0.5 - 1 liter beaker) | | |
|---|---|---|
| Chemical Steps | Temp °F | Time (min.) |
| CL/COND (e.g. CL/COND III) + dispersant (e.g. ACRYSOL®I-1955) | 130 | 5 |
| Rinse | Room | 1 |
| SHADOW® (e.g. SHADOW® 2) | Room | 5 |
| Air Dry (40 PSI) | Room | 20 sec |
| Oven Dry | 190 | 15 |

To Electroplating

METHODS OF AVOIDING BLOWHOLE FORMATION BY CONDITIONING THROUGH HOLES AND GLASS

CROSS-REFERENCE TO RELATED APPLICATIONS

This is a divisional of application Ser. No. 09/478,587 filed Jan. 6, 2000, now U.S. Pat. No. 6,375,731. The entire specification and all the claims of U.S. Ser. No. 09/478,587 are hereby incorporated by reference.

STATEMENT REGARDING FEDERALLY SPONSORED RESEARCH OR DEVELOPMENT

Not Applicable.

BACKGROUND OF THE INVENTION

The present invention is directed to printed wiring boards (PWB's) having through holes, or other substrates, made electrically conductive by applying a conductive coating containing carbon, and more particularly graphite. The invention is more particularly directed to methods of avoiding blowhole formation in printed wiring boards by treating their through holes with compositions comprising a pH buffer, binders, binding agents, dispersing agents, and combinations thereof, that improve the adhesion and coverage of a conductive coating containing graphite to a surface defined by at least one through hole bore or other substrate. ("Through holes" as used herein refers both to through holes and to vias.)

Conductive graphite and carbon black dispersions are used to provide a superior conductive coating on through hole walls and other nonconductive surfaces. Such dispersions, methods for using such dispersions to coat through holes, and improved printed wiring boards fabricated by using such dispersions are defined in U.S. Pat. Nos. 5,476,580 and 5,389,270, respectively issued to Thorn et al. on Feb. 14, 1995, and Dec. 19, 1995. Both patents referred to in the preceding sentence are incorporated herein by reference in their entireties. A graphite composition, cleaners, conditioners, and other materials and directions needed to practice these patents are available under the trademark SHADOWS® from Electrochemicals Inc., Maple Plain, Minn. Other carbon dispersions containing carbon black or graphite are described, for example, in U.S. Pat. No. 5,139,642.

Soldering is carried out by coating the through hole walls and other conductive surfaces of a printed wiring board with hot, molten solder to make electrical connections by wetting and filling the spaces between the conductive through hole surfaces and the leads of electrical components which have been inserted through the through holes. A properly soldered through hole is filled with solder.

A problem with "blowholes" occasionally develops after the through hole wall has received a conductive coating, has been electroplated with copper, and is then suddenly heated, as by contacting it with molten solder. Soldering heats the copper plated through hole walls very quickly. If there are any gaps or voids in the plated copper, moisture in the substrate is vaporized by the hot solder, which can blow some or all of the solder out of the hole and breach the copper layer. The result is a blowhole or a partially-filled or empty hole, any of which is counted as a soldering defect. It is important that voids do not develop in the copper plate.

The problem of blowholes in through holes made electrically conductive by electroless plating, and the solution to blowholes when that technology is used, are described in a series of articles published in CIRCUIT WORLD, Vol. 12 No. 4 (1986), Vol. 13 No. 1 (1986), and Vol. 13 Nos. 2–3 (1987), under the common title, *Blowholing in PTH Solder Fillets*. A related article is C.Lea, *The Harmfulness of Blowholes in PTH Soldered Assemblies*, CIRCUIT WORLD, Vol.16, No.4, (1990). All the articles in this paragraph are incorporated herein by reference in their entirety for their discussion of blowholes in electroless copper technology.

Electroplating copper to the bore of through holes presents several problems as described in U.S. Pat. No. 5,725,807. Chief among these is the requirement for a conductive through hole with a coating of negligible resistance, uniform thickness, durability, and the ability to withstand solder shock tests. This requirement is met, at least in part, by applying an electrically conductive particulate coating of carbon to the through hole. The carbon of the particulate coating is either carbon black or graphite. While the particulate coating described in U.S. Pat. No. 5,725,807 provides distinct advantages and improvements over the prior art, there remains the need to improve the quality of the binding of the particulate coating, and more particularly the binding of the graphite particles to the surface of the through hole.

BRIEF SUMMARY OF THE INVENTION

Accordingly, an object of this invention is to provide improvements in the cleaning and conditioning of through holes and glass fibers.

Another object is to provide a printed wiring board conditioner to improve the adhesion of carbon particles to the conditioned surface.

Yet another object is to provide a substrate conditioner that improves the continuity of coverage of carbon particles on a through hole wall or other substrate.

A further object is to provide a method of soldering through holes to produce fewer blowholes.

At least one of these objects is addressed, in whole or in part, by the present invention.

We have discovered that the binding and continuous coverage of carbon particles to a surface defined by at least one through hole is greatly improved by the addition of an ingredient selected from a pH buffer, a binder, a dispersant, or combinations thereof, to a conditioning formulation applied to a substrate before the carbon particles are applied.

BRIEF DESCRIPTION OF THE SEVERAL VIEWS OF THE DRAWING

The following is a brief description of the drawing which is presented for the purpose of illustrating the invention and not for purposes of limiting the same.

DETAILED DESCRIPTION OF THE INVENTION

Figure 1:
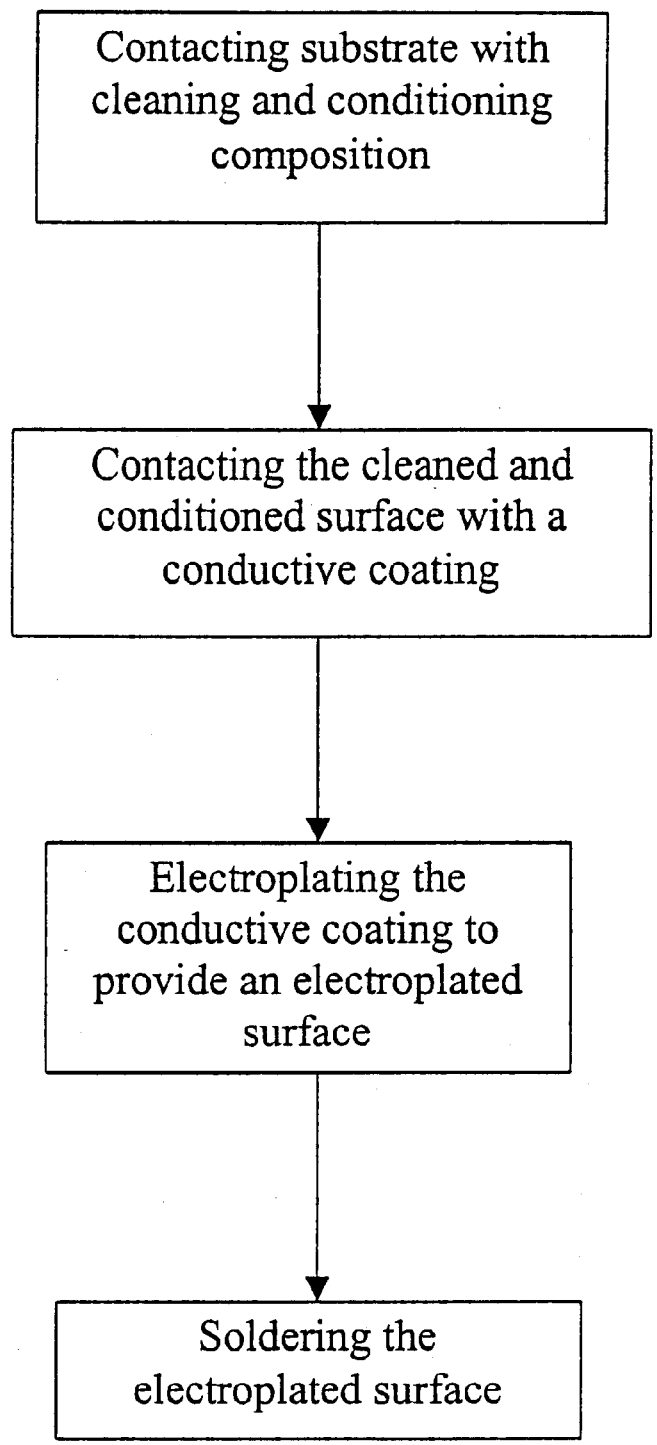
FIG. 1 shows a schematic flow chart depicting one aspect of the present invention.

While the invention will be described in connection with one or more embodiments, it will be understood that the invention is not limited to those embodiments. On the contrary, the invention includes all alternatives, modifications, and equivalents as may be included within the spirit and scope of the appended claims.

The present invention is directed to a conditioning composition including, beyond the usual conditioning ingredients, one or more of the following: a binding agent, a pH buffer, a dispersing agent, and combinations thereof, that improve the adhesion and coverage of a conductive coating containing graphite to a surface defined by at least one through hole bore or other substrate.

Cleaning compositions, conditioning compositions, and cleaner/conditioner compositions contemplated for use in the invention are described in detail in U.S. Pat. Nos. 5,725,807 and 5,690,805, which are incorporated by reference, and in material incorporated therein by reference.

Some of the useful ingredients of such compositions are described below.

Conditioning Agent

In the conditioning step, the substrate is contacted with a conditioning agent, which is a substantive material, commonly a cationic material such as a polyamidoamine, a cationic polymer, a cationic surfactant, or the like. The conditioning agent is applied as an adhesion promoter so the substrate will be attractive to the anionic particles of carbon which are later applied by contacting the substrate with a carbon dispersion.

The conditioner can be an alkaline aqueous solution or dispersion of a conditioning agent selected from the group consisting of:

SANDOLEC CF
SANDOLEC CU
SANDOLEC CS
SANDOLEC CL
SANDOLEC CT
CALLAWAY 6818
CYASTATSP
CYASTAT LS
CYASTAT SN
CYANAMER A-370
MAGNIFLOC 496
DAXAD CP2
PRIMAFLO C C3
CAT-FLOC
CAT-FLOC T
RETEN 210
POLYTEC 7M
PERCOL 727
PERCOL 763
OCTOPOL SDE-25
OCTOPOL SDM-40
GLO-CLEAR 2202
GLO-CLEAR 2220
GLO-CLEAR 2283
PRIFRAC 2990
ALUBRAFSOFT GSS
FIBRABON 35
DENSEFLOC 30
CALLAWAY 6817
CALLAWAY 6831 and combinations of those conditioners.

A conditioner will also commonly contain a base. The bases contemplated herein include lower alkanol amines (lower alkanol being defined as 1- to 4-carbon alcohol moieties), such as ethanolamines, for example mono-, di- or triethanolamine; alkali materials generally, such as alkali metal hydroxides, carbonates, and bicarbonates, for example potassium hydroxide, carbonate, or bicarbonate; other materials capable of raising the pH of the composition, preferably to at least about 9; and mixtures of such materials.

Binding Agent

One component of some of the compositions of the present invention is a water soluble or dispersible binding agent for binding the carbon particles. The binding agent is believed to assist the dispersed carbon particles in adhering to the surface of the non-conductive (i.e., dielectric) substrate which is to be made conductive for electroplating. The binding agent may be present as from about 0% to about 15% by weight, or from about 0.2 to about 10% by weight, or from about 0.5% to about 6% by weight, or from about 1.5% to about 3% by weight, of the composition.

The binding agent of the present invention is preferably any natural or synthetic polymer, polymerizable monomer, or other viscous or solid material (or precursor thereof) that is capable of both adhering to the carbon particles and of receiving an anionic dispersing agent (as described below). For example, the binding agent may be a water soluble or water dispersible material selected from the group consisting of mono- and polysaccharides (or, more broadly, carbohydrates) and anionic polymers. Typically, for purposes of this invention, a 2% by weight aqueous test solution of the binding agent will have a viscosity within the range of 25–800 cps at 25° C., although other concentrations of the binding agent and other viscosities of the complete through hole coating composition are also contemplated herein.

Monosaccharide binding agents contemplated for use herein include tetroses, pentoses, and hexoses. Polysaccharide (which for the present purposes includes disaccharide and higher saccharide) binding agents contemplate for use herein include sucrose (from beets, sugarcane, or other sources), maltose, fructose, lactose, stachyose, maltopentose, dextrin, cellulose, corn starch, other starches, and polysaccharide gums. Polysaccharide gums contemplated for use herein include agar, arabic, xanthan (for example, KELZAN industrial grade xanthan gum, available from the Kelco Div. of Merck & Co, Inc. of Rahway, N.J.), pectin, alginate, tragacanath, dextran, and other gums. Derivative polysaccharides contemplated for use herein include cellulose acetates, cellulose nitrates, methylcellulose, and carboxymethylcellulose. Hemicellulose polysacharides contemplated for use herein include d-gluco-d-mannans, d-galacto-d-gluco-d-mannans, and others. Anionic polymers contemplated herein include the alkylcelluloses or carboxyalkylcelluloses, their low- and medium-viscosity alkali metal salts. Examples include methyl cellulose (CAS registry no.: 9004-67-5); sodium carboxymethylcellulose, or "CMC"; CAS register no.: 9004-32-4; cellulose ethers; and nitrocellulose. Examples of such anionic polymers include KLUCEL hydroxypropylcellulose; AQUALON CMC 7L sodium carboxymethylcellulose, and NATROSOL hydroxyethyl cellulose, which are all commercially available from Aqualon Company of Hopewell, Va.; ethylcellulose, available from Hercules of Wilmington, Del.; METHOCEL cellulose ethers, available from Dow Chemical Co., Midland, Mich.; and nitrocellulose, which is also available from Hercules. Sodium CMC is an anionic water soluble polymer derived from cellulose. Sodium CMC is believed to act as a thickener, binder, stabilizer, protective colloid, suspending agent, and rheology, or control flow, agent.

The acrylics contemplated herein for use as binding agents include polymerizable monomers and polymers, for example, emulsion polymers commonly known as acrylic latices. The monomers include acrylamide, acrylonitrile, acrylic acid, methacrylic acid, glycidyl methacrylate, and others. The acrylic polymers include polymers of any one or more of the foregoing monomers; polyacrylamide polymers such as SEPARAN NP10, SEPARAN MGL, SEPARAN 870, and SEPARAN MG200 polymers; polyacrylic acid; acrylic ester polymers such as polymethyl acrylate, polyethyl acrylate, polypropyl acrylate, polyisopropyl acrylate, polybutyl acrylate, polyisobutyl acrylate, polypentyl acrylate, polyhexyl acrylate, polyheptyl acrylate, polyoctyl acrylate, and polyisobornyl acrylate; and other polyacrylates. Suitable acrylics available to the trade include NALCO 603, PURIFLOC C31, and ACRYSOL® acrylics sold by Rohm and Haas Company of Philadelphia, Pa.

Other binding agents are also contemplated herein. The vinyl resins contemplated herein include polyvinyl acetates, polyvinyl ethers, and polyvinyl chlorides. The pyrrolidinone resins contemplated herein include poly(N-vinyl-2pyrrolidinone). Representative trade materials of this kind are PVP K-60 resin, PVP/VA E335 resin, PVP/VA 1535 resin, and other resins sold by GAF Corporation. The polyols contemplated herein include polyvinyl alcohols. The polyvinyl alcohols contemplated herein include ELVANOL 90-50, ELVANOL HV, ELVANOL 85-80, and others.

Cationic resins and other materials contemplated for use herein as binding agents include polyethylenimine, methylaminoethyl resins, alkyltrimethylamnonium chlorides, and others. Esters of olefinic alcohols, aminoalkyl esters, esters of ether alcohols, cycloalkyl esters, and esters of halogenated alcohols are also contemplated for use as binding agents. Polyethylene oxides, such as materials available under the trade names NSR N-10, NSR N3000, and NSR 301 from Union Carbide Corp., are contemplated herein.

Still more binding agents contemplated herein include epoxy resins, cresol novolac resins, phenol novolac resins; epichlorohydrin resins; bisphenol resins; phenolic resins, such as DURITE AL-5801A resin available from Borden Packaging and Industrial Products of Louisville, Ky.; and natural resins and polymerizable materials such as damar, manila, rosin gum, rosin wood, rosin tall oil, and others.

A practical upper limit to the amount of binding agents used is contemplated to be that amount which materially interferes with the conductivity of the resulting conductive coatings by diluting the conductive solids in the composition after it is deposited as a film.

Dispersing Agent

Another component of some of the compositions of the present invention is an anionic dispersing agent. The anionic dispersing agent has a molecular weight less than about 1000 Daltons, so it is a substantially smaller molecule than the binding agent.

The anionic dispersing agent has a hydrophobic end and a hydrophilic (anionic) end. It functions by surrounding the bound carbon particles and causing the bound particles to disperse. It is believed that the hydrophobic end of each anionic dispersing agent is attracted to the hydrophobic region of the binding agent, thereby causing the anionic end of the anionic dispersing agent to stick out into the aqueous surrounding dispersing medium. When each bound carbon particle has sufficient dispersing agent bound to it, the sphere of anionic charges surrounding each particle causes the particles to repel one another, and thus, to disperse.

The amount of anionic dispersing agent that is contemplated in the composition of the present invention is an amount sufficient to cause the bound carbon particles to disperse in the aqueous dispersing medium. The amount of dispersing agent that is used is dependent upon the size of the carbon particle and the amount of binding agent bound thereto. As a general rule, smaller carbon particles require lesser amounts of dispersing agent than would be required to disperse larger particles. To determine the amount of dispersing agent that is required in any particular case, one of ordinary skill in the art can begin by adding ever increasing amounts of dispersing agent to the bound carbon particles until a sufficient amount is added to cause the particles to disperse. This amount of dispersing agent is the minimum effective amount of dispersing agent. Increasing amounts of dispersing agent could be added without adversely affecting the dispersion of the carbon particles. To ensure that the particles remain dispersed, one could add a ten percent greater amount of dispersing agent than is needed. Thus, for purposes of the present invention, the amount of anionic dispersing agent that is used in the composition of the present invention must be an amount that is effective for dispersing the bound carbon particles. For example, the anionic dispersing agent may be present as from about 0% to about 10% by weight, alternatively from about 0.01% to about 5% by weight, alternatively from about 0.1% to about 2% by weight of the composition.

A practical upper limit to the amount of anionic dispersing agents used is contemplated to be that amount which materially interferes with the conductivity of the resulting conductive coatings by diluting the conductive solids in the composition after it is deposited as a film.

Suitable anionic dispersing agents include acrylic latices, aqueous solutions of alkali metal polyacrylates, and similar materials. Specific dispersing agents contemplated herein include ACRYSOL® I-1955, ACRYSOL® G110, and ACRYSOL® I-545 dispersing agents, all of which are commercially available from the Rohm and Haas Co., Philadelphia, Pa. The ACRYSOL® dispersing agents may be used alone or together.

Buffers

The composition and method of the present invention is capable of being run over a wide pH range. The present composition may have a pH within the range of from about 4 to about 14. An alternative pH range is from about 9 to about 11, another is from about 9.5 to about 10.5, and still another is from about 10.7 to about 11.

Preferably, the pH is maintained by a pH buffer. The buffer functions by precluding or minimizing changes in pH such as may occur during the course of a run as a large number of boards are treated with the composition of the present invention. The maintenance of a constant or nearly constant pH insures the composition is reproducible from board to board. Another advantage of using a buffer system is that the normalities of one or more buffer components can be measured and adjusted to maintain proper process control.

A pH in the preferred range can be provided by a carbonate-bicarbonate buffer. The use of other pH buffering systems, such as phosphate, acetate, borate, barbital, and the like, are well known in the art. The anions of the buffer may be associated with any suitable cation, such as an alkali metal cation, such as sodium, potassium, or lithium; or an ammonium cation.

Cleaning/Conditioning

The present invention can also be carried out by using a single treatment both to clean and condition a nonconductive substrate. In the event a combined cleaner/conditioner is to be made, cleaning ingredients can be added to the conditioner. The principal cleaning ingredients contemplated herein, beyond the ingredients specified previously for a conditioner formulation, are one or more of the following: nonionic surfactants, glycols, or chelating agents.

The nonionic surfactants contemplated herein include the following:

TERGITOL 15-S-9
TERGITOL 15-S-15
NEODOL 25-12
IGEPAL CO730
IGEPAL CO887
TERGITOL NP-15
MIRANOL 2M-CA
MIRANOL 2M-CT
MIRANOL CM-SF
MIRANOL J2M-SF
MIRANOL S2M-SF and combinations of those surfactants.

The alkylene glycols contemplated herein include 1- to 4-carbon alkylene glycols and their dimers and oligomers. Specific alkylene glycols contemplated herein include ethylene glycol, propylene glycol, butylene glycols, diethylene glycol, triethylene glycol and mixtures of such materials.

The chelating agents contemplated herein include alkali metal salts of ethylenediaminetetraacetic acid (EDTA), for example, sodium EDTA ($Na_4EDTA$). Other suitable chelating agents may also be readily found by one of ordinary skill in the art.

Figure 2:
FIG. 2 shows the chemical steps in one aspect of the present invention.

Referring to FIGS. 1 and 2, the cleaning and conditioning of the substrate forms part of a step by step procedure in which a suitable substrate might be placed in a bath containing the cleaner/conditioner, followed by a rinsing step, followed by a carbon coating composition such as SHADOW® 1 or SHADOW® 2, followed by the electroplating step.

Cleaner/conditioners and conditioners according to the present invention have been found to reduce the problem of blowholes, which the inventors believe is related to the formation of voids.

It is believed that voids occur because the conductive coating applied to the substrate is deficient in some manner. Where the conductive coating, for example a graphite coating, fails to cover the substrate adequately, the copper electroplating of the conductive coating results in voids. To avoid voids, the conductive coating must be applied evenly and consistently to the substrate and remain in place. It is believed that adhesion and coverage of the conductive coating to the surface of the substrate are important factors in minimizing the occurrence of blowholes.

While the invention is not limited by any theory as to why the composition of the invention improves the coverage and adhesion of a carbon coating to the surface of the through hole, the inventors believe the composition functions as follows. When the composition is contacted with the non-conductive surface of the through hole, a thin layer of the composition is believed to adhere to the surface by means of largely non-covalent interactions with the surface of the substrate.

It is believed that when the conductive carbon composition is contacted with the substrate that has been treated with the composition of the invention, the carbon adheres to the surface in a continuous and even manner to achieve good coverage. Subsequent copper electroplating of the conductive carbon layer produces few or no voids. Soldering the copper plated through holes of the invention results in few or no blowhole problems.

One way for assessing the effectiveness of the cleaning and conditioning agents is by performing the hot oil thermal shock test. Hot oil is substituted for hot solder to provide a method to detect unwanted voids in copper plated substrate, particularly copper plated through holes. The copper plated through hole is contacted with the hot oil and the thermal shock causes moisture trapped in any voids to vaporize. Through holes and vias subjected to the hot oil test may be sectioned and examined microscopically for voids. Alternatively, the through holes may be conventionally electroplated as printed wiring boards would be processed, the through holes then sectioned by cutting the boards, and the plated through holes evaluated for lumpiness, pullaway, and voids under microscopic examination.

The effectiveness of the cleaning conditioning process of the present invention was partly evaluated by assessing the degree of coverage of the graphite using a back lighting technique and further evaluated by a hot oil test procedure with an accompanying blowhole evaluation.

Back Lighting Technique

In the back lighting technique a treated substrate is examined at low magnification to assess the degree of coverage in terms of backlight-values that can range from 1 to 10 or 10% to 100%.

The Hot Oil Test Procedure

The hot oil test procedure and accompanying blowhole evaluation is described here with reference to SHADOW® 2 graphite dispersion a cleaner/conditioner formulation. The hot oil test procedure and accompanying blowhole evaluation can be carried out by making up separate one liter amounts (with DI, deionized water) of SHADOW® 2 (8%) one part (available from Electrochemicals Inc.) and one part DI to provide a "SHADOW® bath"; microetch solution: 75 g/l sodium persulfate & 1% v/v sulfuric acid; Acid Cleaner 7A 15% v/v (available from Electrochemicals Inc.) With these solutions on hand place one to four coupons (i.e. substrate) on copper hooks and perform the steps listed in Table 4:

TABLE 1

| Step | Time | Temperature |
| --- | --- | --- |
| 1. cleaner/conditioner | 5 min. (± 1 min.) | 135° F. (± 5° F.) |
| 2. Running water rinse | 45 sec (± 15 sec) | Ambient |
| 3. SHADOW ® bath | 5 min (± 1 min.) | Ambient |
| 4. Air brush with compressed air | n/a | Ambient |
| 5. Oven dry | 15 min. (± 1 min.) | 200° F. (± 5° F.) |
| 6. microetch | 1 min. (± 30 sec) | Ambient |
| 7. Running water rinse | sufficient to remove remnants of SHADOW ® bath | Ambient |
| 8. Acid Cleaner 7A | 3 min. (± 30 sec) | 130° F. (± 5° F.) |
| 9. Running water rinse | 45 sec (± 15 sec) | Ambient |
| 10. Copper plating bath (current @ 10.5 A for 4 coupons) | 75 min. | Ambient |
| 11. Running water rinse | 45 sec (± 15 sec) | Ambient |
| 12. Air Brush | sufficient to remove access water | Ambient |

Blowhole Evaluation

After step 12 of Table 4 is complete a blowhole evaluation is performed to determine the number of holes that outgas. To ensure accurate counts, a VCR and camera may be used. The blowhole evaluation can be carried out, as follows:

(i) Heat a quantity of oil (source for this oil etc.) sufficient to cover the coupons (heat to 235° C.). Use stir bar to stir oil.

(ii) Set up a suitable camera with VCR, check focus of camera by focusing on heated oil. Start camera and VCR.

(iii) Turn off stir bar, using tongs and protective face mask carefully place the coupon in the hot oil. Record the coupon using the camera for about 5 seconds.

(iv) Remove the coupon from the hot oil. Stop recording.

(v) Rewind VCR tape and play the recording on a monitor by advancing in 3 second (±1/30 sec.) intervals. Count the number of holes that were outgassing and the total number of holes. The "Hot Oil Test %" result is calculated as follows:

Hot Oil Test %=[(number of holes that were outgassing)÷(total number of holes)]*100.

The following examples represent specific but nonlimiting embodiments of the present invention:

EXAMPLE 1

The effect of different cleaning and conditioning agents ("CL/COND") with and without binders on the degree of coverage achieved with the SHADOW® 1 Colloidal Graphite Dispersion was examined. The formulations and resulting observations are set out in Table 2.

TABLE 2

SHADOW ® 1 and CL/COND (with/without Binders)

| Run # | Formulation*[1] | Coverage in 10 minute plating Scale 1–10 | Comments |
|---|---|---|---|
| 1 | Colloidal Graphite Dispersion One part SHADOW ® 1, One part DI*[2] water CL/COND CL/COND III*[3] 20% v/v | 9.0 | No binder |
| 2 | Colloidal Graphite Dispersion One part SHADOW ® 1, One part DI* water CL/COND CL/COND III, 20% v/v ACRYSOL ® I-1955 25 ml/500 ml DI | 10.0 Perfect | ACRYSOL ® I-1955 binder in combination with CL/COND III provides the best coverage with SHADOW ® 1 |

*[1]The "%" values in the "Formulation" column indicate the proportion of the as-sold cleaner/conditioner used in the bath; applies to all Examples.
*[2]Deionized water; applies to all Examples.
*[3]In practice, the working cleaner/conditioner was maintained between the range of 140° F. to 160° F. (60° C.–71° C.); applies to all Examples.

EXAMPLE 2

The effect of different cleaning and conditioning agents ("CL/COND") with and without binders on the degree of coverage achieved with AQUADAG E, sold by Acheson Colloids Company, P.O.box 611757, Port Huron, Mich., Asbury Graphite Mills Inc., Asbury, N.J. was examined. The formulations and resulting observations are set out in Table 3.

TABLE 3

AQUADAG E and CL/COND (with/without Binders)

| Run # | Formulation | Coverage in 10 minute plating Scale 1–10 | Comments |
|---|---|---|---|
| 1 | Colloidal Graphite Dispersion AQUADAG E 115 ml make up to 500 ml with DI CL/COND CL/COND III 20% v/v | 8.5–9.0 Pin voids | No binder in cleaner/conditioner. small patch voids were observed. |
| 2 | Colloidal Graphite Dispersion AQUADAG E 115 ml make up to 500 ml with DI CL/COND ACRYSOL ® I-1955 50 ml/500 ml DI | 7.0–8.0 Big patch voids observed. | ACRYSOL ® I-1995 binder as the sole CL/COND does not promote good coverage with AQUADAG E. |
| 3 | Colloidal Graphite Dispersion AQUADAG E 115 ml make up to 500 ml with DI CL/COND MEA 5 ml/500 DI ACRYSOL ® G110 10 ml/500 DI | 9.0 Only pin voids. Better than run #1 | ACRYSOL ® G110 binder works well in conjunction with monoethanolamine as a cleaner/conditioner. |
| 4 | Colloidal Graphite Dispersion AQUADAG E 115 ml make up to 500 ml with DI CL/COND CL/COND III 20% v/v CMC 5 g/500 ml Tamol 9GO 5 ml/500 | 9.0–9.7 Only pin voids, better than run #1 | CMC binder n CL/COND helps to promote coverage. |

EXAMPLE 3

The effect of different cleaning and conditioning agents ("CL/COND") with the SHADOW® 1 and SHADOW® 2 formulations was examined. The formulations and resulting observations are set out in Table 4.

TABLE 4

CL/COND with Shadow 1 vs. CL/COND with SHADOW ® 2

| Run | Formulation | Coverage in 10 minute plating Scale 1–10 | Hot Oil Test % | Comments |
|---|---|---|---|---|
| #1 | Colloidal Graphite Dispersion A" 1 part SHADOW ® 2 (8% conc.) 1 part DI Colloidal Graphite Dispersion "B" 2 parts Shadow 1 1 part DI CL/COND for A & B CL/COND III 20% v/v | A) 9.0 to 9.5 B) 9.0 to 9.5 | A) 60 B) 16 | No binder in cleaner/ conditioner. |
| #2 | Colloidal Graphite Dispersion A" 1 part SHADOW ® 2 (8% conc.) 1 part DI Colloidal Graphite Dispersion "B" 2 parts Shadow 1 1 part DI CL/COND for A & B CL/COND III 20% v/v 50 mls of ACRYSOL ® I-1955 (50 mls/l) | A) 9.0 B) 10.0 | A) 100 B) 5.5 | CL/COND III with ACRYSOL ® I-1955 dispersant provides better Coverage and Hot Oil Test results with Shadow 1 than the same formulation provides without a binder in the cleaner/ conditioner. |
| #3 | Colloidal Graphite Dispersion A" 1 part SHADOW ® 2 (8% conc.) | A) 9.5–9.7 | A) 21 | No binder in cleaner/ conditioner. |

TABLE 4-continued

CL/COND with Shadow 1 vs. CL/COND with SHADOW ® 2

| Run | Formulation | Coverage in 10 minute plating Scale 1–10 | Hot Oil Test % | Comments |
|---|---|---|---|---|
| | 1 part DI Colloidal Graphite Dispersion "B" 2 parts Shadow 1 1 part DI CL/COND for A & B (per liter): 1 g KOH (86%), 25.0 g Grafquat HS 100 25.5 g Neodol 91-8, 50 mg Mercapto Benzo Thiazole ("MBT"), 2.0 g Versene 100 ®, DI to 1.0 liter | b) 9.5 | B) 36 | |
| #4 | Colloidal Graphite Dispersion 1 part SHADOW ® 2 (8% conc.) 1 part DI 0.4 g/500 ml CMC* 7L CL/COND CL/COND III 20% v/v ACRYSOL ® I-1955 50 ml/l | 9.7 | 8 | CMC 7L with SHADOW ® 2 and CL/COND III with ACRYSOL ® I-1955 dispersant provide good Hot Oil Test result. (Compare to Run #2A). |
| #5 | Colloidal Graphite Dispersion SHADOW ® 2 (8% conc.): 350 ml DI water to 500 ml CL/COND (1 liter) CL/COND III 20% v/v (200 mls) ACRYSOL ® I-1955 50 mls CMC 7L 0.5 g DI to 1 liter | 10.0 | 7.0 | CL/COND with ACRYSOL ® I-1955 dispersant and CMC 7L binder provides good Hot Oil Test with SHADOW ® 2. (Compare to Run #2A). |

*Polysacharide type binder: carboxymethyl cellulose, available from Rohm and Haas Company The foregoing examples show that better coverage and fewer blow holes can be obtained by adding a binder and/or a dispersing agent, as defined above, to the cleaner/conditioner or conditioner formula applied before a carbon containing is applied.

While the invention is described above in connection with preferred or illustrative embodiments and examples, they are not intended to be exhaustive or limiting of the invention. Rather, the invention is intended to cover all alternatives, modifications and equivalents included within its spirit and scope of the invention, as defined by the appended claims.

What is claimed is:

1. A method for providing a soldered surface that is substantially free of blow-holes, comprising:
    (a) contacting a surface with a conditioning composition to provide a conditioned surface, said conditioning composition comprising a cationic conditioning agent and at least one ingredient selected from an anionic dispersing agent and a binder selected from the group consisting of carbohydrates, anionic polymers, acrylics, vinyl resins, pyrrolidinone resins, polyols, polyvinyl alcohols, epoxy resins, cresol novolac resins, phenol novolac resins, epichlorohydrin resins, bisphenol resins, phenolic resins, natural resins, polymerizable materials, and combinations thereof;
    (b) contacting said conditioned surface with a conductive carbon coating to provide a carbon coated surface;
    (c) electroplating said carbon coated surface to provide an electroplated surface; and
    (d) soldering said electroplated surface to provide a soldered surface that is substantially free of blow-holes.

2. The composition of claim 1, wherein said at least one ingredient comprises an anionic dispersing agent.

3. The composition of claim 1, wherein said at least one ingredient comprises a binder.

4. The composition of claim 1, wherein said at least one ingredient comprises sodium carboxymethylcellulose.

5. The composition of claim 1, wherein said at least one ingredient comprises a carbohydrate.

6. The composition of claim 1, wherein said at least one ingredient comprises an anionic polymer.

7. The composition of claim 1, wherein said at least one ingredient comprises an acrylic.

8. The composition of claim 1, wherein said at least one ingredient comprises starch.

9. A method for providing a soldered surface that is substantially free of blow-holes, comprising:
    (a) contacting a surface with a conditioning composition to provide an electrically non-conductive conditioned surface, said conditioning composition comprising a cationic conditioning agent and at least one ingredient selected from an anionic dispersing agent and a binder;
    (b) contacting said conditioned surface with a conductive carbon coating to provide an electrically conductive carbon coated surface;
    (c) electroplating said carbon coated surface to provide an electroplated surface; and
    (d) soldering said electroplated surface to provide a soldered surface that is substantially free of blow-holes.

10. A method for providing a soldered surface that is substantially free of blow-holes, comprising:
    (a) contacting a surface with an amount of conditioning composition effective to provide a conditioned surface and reduce formation of blowholes after soldering, said conditioning composition comprising a cationic conditioning agent and at least one ingredient selected from an anionic dispersing agent and a binder;
    (b) contacting said conditioned surface with a conductive carbon coating to provide a carbon coated surface;
    (c) electroplating said carbon coated surface to provide an electroplated surface; and
    (d) soldering said electroplated surface to provide a soldered surface that is substantially free of blow-holes.

* * * * *